United States Patent
Tan et al.

(10) Patent No.: US 8,643,427 B2
(45) Date of Patent: Feb. 4, 2014

(54) SWITCHING DEVICE

(75) Inventors: Ying-Chow Tan, Singapore (SG);
Osama K A Shana'a, Singapore (SG)

(73) Assignee: MediaTek Singapore Pte. Ltd., Singapore (SG)

( * ) Notice: Subject to any disclaimer, the term of this patent is extended or adjusted under 35 U.S.C. 154(b) by 200 days.

(21) Appl. No.: 13/108,013

(22) Filed: May 16, 2011

(65) Prior Publication Data
US 2012/0081171 A1    Apr. 5, 2012

Related U.S. Application Data

(60) Provisional application No. 61/389,574, filed on Oct. 4, 2010.

(51) Int. Cl.
*H03K 17/16* (2006.01)
*H04B 1/44* (2006.01)

(52) U.S. Cl.
USPC ........... 327/389; 327/427; 327/434; 327/534; 455/78; 333/101; 333/103

(58) Field of Classification Search
USPC ......... 327/379, 387–389, 427, 434, 534, 537; 333/101, 103; 455/78
See application file for complete search history.

(56) References Cited

U.S. PATENT DOCUMENTS

| 7,848,712 | B2 * | 12/2010 | Fu et al. ........................... 455/80 |
| 8,228,112 | B2 * | 7/2012 | Reynolds ....................... 327/427 |
| 8,229,367 | B2 * | 7/2012 | Chan et al. ...................... 455/78 |
| 8,288,829 | B2 * | 10/2012 | Zhang et al. ................... 257/392 |
| 2005/0107043 | A1 | 5/2005 | Avasarala |
| 2008/0079650 | A1 | 4/2008 | Constantinidis |
| 2009/0102542 | A1 * | 4/2009 | Reynolds ....................... 327/478 |
| 2012/0025927 | A1 * | 2/2012 | Yan et al. ....................... 333/103 |

FOREIGN PATENT DOCUMENTS

CN            201479103         5/2010

* cited by examiner

*Primary Examiner* — Patrick O'Neill
(74) *Attorney, Agent, or Firm* — Winston Hsu; Scott Margo

(57) ABSTRACT

A switching device includes: a first switching circuit, having a control node coupled to a first control signal, and arranged to selectively couple a signal node to a first amplifying circuit according to the first control signal; and a first control circuit, having a first control node and a second control node coupled to the control node of the first switching circuit and the signal node, respectively, wherein when the first switching circuit is controlled to electrically disconnect the signal node from the first amplifying circuit and a voltage level of the signal node reaches a first predetermined voltage level, the first control circuit is arranged to make the control node of the first switching circuit electrically connected to the signal node.

22 Claims, 5 Drawing Sheets

SWITCHING DEVICE

CROSS REFERENCE TO RELATED APPLICATIONS

This application claims the benefit of U.S. Provisional Application No. 61/389,574, which was filed on 2010 Oct. 4 and is included herein by reference.

BACKGROUND

The present invention relates to a switching device, and more particularly to a switching device capable of handling signal having a large swing.

In a wireless communication system, e.g., an FM (Frequency Modulation) transceiver, both the receiver and the transmitter of the FM transceiver share the same antenna. Therefore, when the wireless communication system is under operation, a switch is controlled to switch between the receiver and the transmitter to couple either the receiver or the transmitter to the antenna. According to one conventional wireless communication system, the switch is installed in series with the receiver instead of the transmitter since the distortion and out-of-band emission of the transmitter is more stringent than the linearity of the receiver. For this example, when the switch is turned ON (i.e. short) under the receiving mode, the switch should have the characteristic of low insertion loss, large input range, low distortion, low die area, and etc. When the switch is turned OFF (i.e. open) under the transmitting mode, the switch should have the characteristic of capable of handling large swing signal, providing low distortion in its OFF state, not disrupting the normal transmitting operation or function of the transmitter, and etc. However, due to the circuit complexity of both the receiver and the transmitter, it is very difficult to accomplish the above-mentioned characteristic in the switch without having to drastically reduce the maximum allowable input RF (Radio Frequency) signal to the receiver and/or the maximum transmitted output power. Therefore, providing a switch that meets the above-mentioned requirements to switch between the receiver and the transmitter in the wireless communication system has become an important issue in this field.

SUMMARY

One of the objectives of the present invention is therefore to provide a switching device capable of handling signal having a large swing.

According to a first embodiment of the present invention, a switching device is provided. The switching device comprises a first switching circuit and a first control circuit. The first switching circuit has a control node coupled to a first control signal, and the first switching circuit is arranged to selectively couple a signal node to a first amplifying circuit according to the first control signal. The first control circuit has a first control node and a second control node coupled to the control node of the first switching circuit and the signal node, respectively, wherein when the first switching circuit is controlled to electrically disconnect the signal node from the first amplifying circuit and a voltage level of the signal node reaches a first predetermined voltage level, the first control circuit is arranged to make the control node of the first switching circuit electrically connected to the signal node.

According to a second embodiment of the present invention, a switching device is provided. The switching device comprises a switching circuit having a control node coupled to a first control signal. The switching circuit is arranged to selectively couple a signal node to a first amplifying circuit according to the first control signal. The switching circuit comprises a field-effected transistor and a first resistive circuit. The field-effected transistor has a gate node coupled to the first control signal, a first connecting node coupled to the signal node, and a second connecting node coupled to the first amplifying circuit, the field-effected transistor is formed in a first doped well. The first resistive circuit is coupled to the first doped well in series, wherein when the switching circuit is controlled to electrically disconnect the signal node from the first amplifying circuit and the voltage level of the signal node reaches a second predetermined voltage level, the first resistive circuit is arranged to limit a current flowing into the first doped well.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the description and following claims to refer to particular components. As one skilled in the art will appreciate, electronic equipment manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

Figure 1:
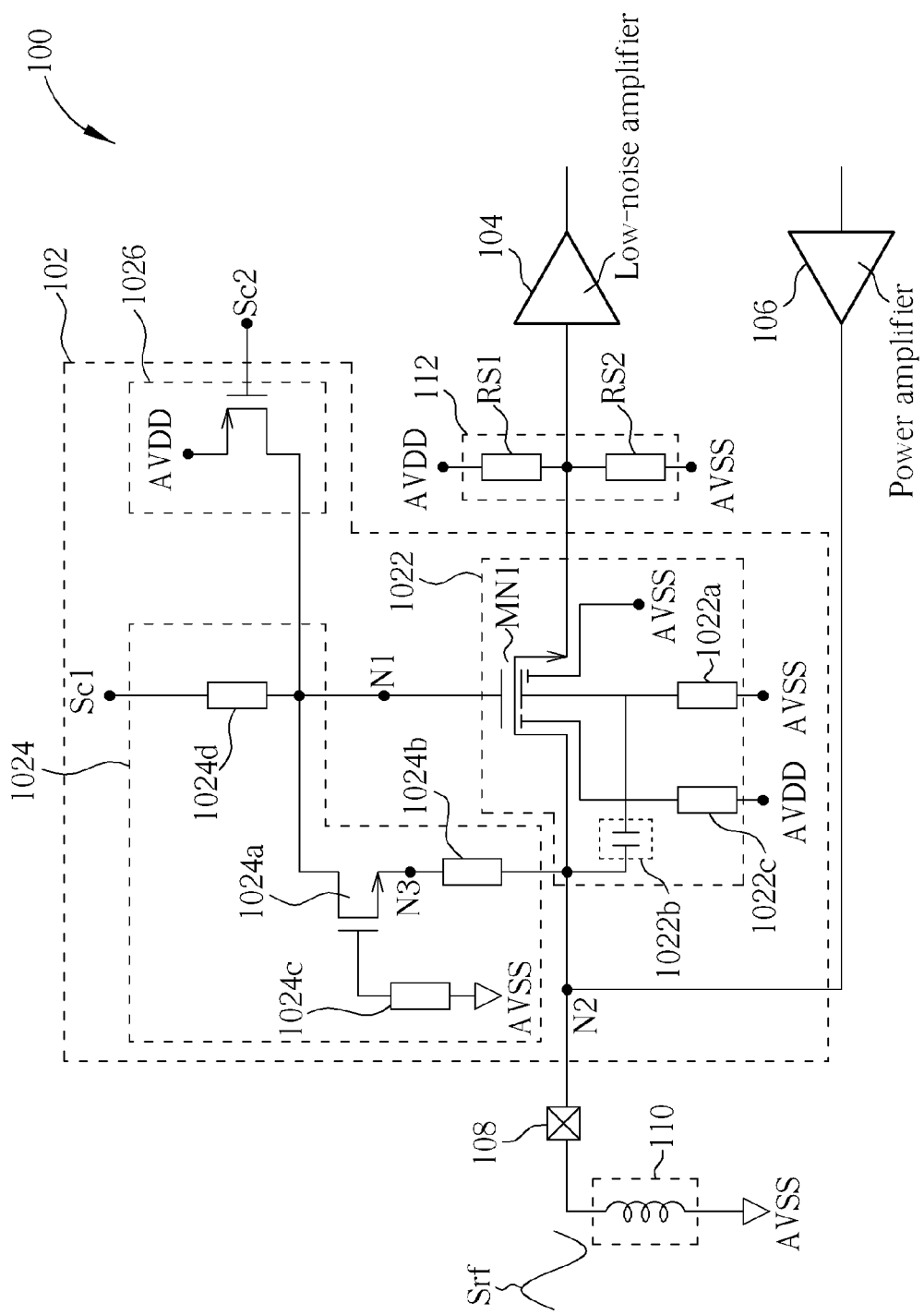
FIG. 1 is a diagram illustrating a front end circuit according to an embodiment of the present invention.

Please refer to FIG. 1. FIG. 1 is a diagram illustrating a front end circuit 100 according to an embodiment of the present invention. The front end circuit 100 comprises a switching device 102, a low-noise amplifier 104, a power amplifier 106, a pad 108, an inductor 110, and a biasing circuit 112, wherein the switching device 102, the low-noise amplifier 104, the power amplifier 106, and the pad 108 are configured as an integrated circuit, i.e. a single chip. A first terminal of the inductor 108 is externally coupled to the integrated circuit via the pad 108, and a second terminal of the inductor 108 is coupled to the ground voltage AVSS. Furthermore, an embedded antenna (not shown) may be arranged to directly couple to the pad 108 to make it in parallel to the inductor 108. In other words, there is no AC (Alternating Current) coupling capacitor installed between the embedded antenna and the pad 108, therefore the DC (Direct current) bias point of at the pad 108 connected to the embedded antenna is substantially 0V (Volt). Furthermore, in this exemplary embodiment, the front end circuit 100 can be the front end of a frequency modulation (FM) communication system.

The switching device 102 comprises a first switching circuit 1022, a first control circuit 1024, and a second control circuit 1026. The first switching circuit 1022 may be T/R (Transmitter/Receiver) switch, and has a control node N1 coupled to a first control signal Sc1, the first switching circuit 1022 is arranged to selectively couple a signal node N2 to a first amplifying circuit, i.e. the low-noise amplifier 104, according to the first control signal Sc1. The first control circuit 1024 has a first control node and a second control node coupled to the control node N1 of the first switching circuit 1022 and the signal node N2, respectively, the first control circuit 1024 is arranged to make the control node N1 of the first switching circuit 1022 electrically connected to the signal node N2 when the first switching circuit 1022 is controlled to electrically disconnect the signal node N2 from the low-noise amplifier 104 and a voltage level Vn2 of the signal node N2 reaches a first predetermined voltage level Vp1.

Furthermore, in this exemplary embodiment, the first switching circuit 1022 may be a field-effected transistor. More particularly, the first switching circuit 1022 comprises an N-type field-effected transistor MN1 as shown in FIG. 1, and the N-type field-effected transistor MN1 has a gate node coupled to the first control signal Sc1, a first connecting node coupled to the signal node N2, and a second connecting node coupled to the low-noise amplifier 104.

More specifically, the first switching circuit 1022 further comprises a first resistive circuit 1022a, a capacitive circuit 1022b, and a second resistive circuit 1022c. In this exemplary embodiment, the N-type field-effected transistor MN1 is formed in a first doped well, e.g. a P-well. One node of the first resistive circuit 1022a is coupled to the P-well in series, and the other node of the first resistive circuit 1022a is coupled to a ground voltage AVSS. The first resistive circuit 1022a is arranged to limit a current flowing into the P-well from the ground voltage AVSS when the first switching circuit 1022 is controlled to electrically disconnect the signal node N2 from the low-noise amplifier 104 and the voltage level of the signal node N2 reaches a second predetermined voltage level Vp2. The capacitive circuit 1022b is coupled between the first connecting node, i.e. N2, of the N-type field-effected transistor MN1 and the P-well. It should be noted that, in this exemplary embodiment, the N-type field-effected transistor MN1 is further formed in a second doped well, e.g. a deep N-well. Then, one node of the second resistive circuit 1022c is coupled to the deep N-well in series, and the other node of the second resistive circuit 1022c is coupled to a supply voltage AVDD.

In addition, the first control circuit 1024 comprises a field-effected transistor 1024a, a resistive circuit 1024b, a resistive circuit 1024c, and a resistive circuit 1024d. The field-effected transistor 1024a may be an N-type field-effected transistor, and the field-effected transistor 1024a has a gate node coupled to a reference voltage, e.g. the ground voltage AVSS, a first connecting node coupled to the first control node, i.e. the control node N1, and a second connecting node coupled to the second control node, i.e. the signal node N2. The resistive circuit 1024b is coupled between the second connecting node N3 of the field-effected transistor 1024a and the second control node N2. The resistive circuit 1024c is coupled between the gate node of the field-effected transistor 1024a and the reference voltage AVSS. The resistive circuit 1024d is coupled between the control node N1 of the first switching circuit 1022 and the first control signal Sc1.

The second control circuit 1026 has a first control node and a second control node coupled to the control node (i.e. N1) of the first switching circuit 1022 and a reference voltage, i.e. a supply voltage AVDD, respectively. The second control circuit 1026 is arranged to keep a voltage level of the control node (i.e. N1) of the first switching circuit 1022 substantially intact when the first switching circuit 1022 is controlled to connect the signal node N2 from the first amplifying circuit, i.e. the low-noise amplifier 104. In this exemplary embodiment, the second control circuit 1026 may be a field-effected transistor. More particularly, the second control circuit 1026 may be a P-type field-effected transistor as shown in FIG. 1, and the P-type field-effected transistor has a gate node coupled to a second control signal Sc2, a first connecting node coupled to the control node (i.e. N1) of the first switching circuit 1022, and a second connecting node coupled to the supply voltage AVDD. Furthermore, the second control signal Sc2 is an inverse version of the first control signal Sc1.

The biasing circuit 112 comprises a first resistive circuit RS1 and a second resistive circuit RS2 coupled between the supply voltage AVDD and the ground voltage AVSS, the first resistive circuit RS1 and the second resistive circuit RS2 are arranged to make the second connecting node of the N-type field-effected transistor MN1 to be biased at a third predetermined voltage level Vp3 when the first switching circuit 1022 is controlled to electrically disconnect the signal node N2 from the low-noise amplifier 104 as shown in FIG. 1.

When the front end circuit 100 is arranged to transmit a RF (Radio Frequency) signal Srf to the embedded antenna, i.e. the transmitting mode, the first switching circuit 1022 is controlled to turn off by the first control signal Sc1 to make the signal node N2 to electrically disconnect from the low-noise amplifier 104, i.e. the voltage level of the first control signal Sc1 is controlled to be the low voltage level, e.g. 0V, to turn off the first switching circuit 1022. Then, the power amplifier 106 is arranged to generate the RF signal Srf to the embedded antenna via the pad 108. As the signal node N2 is coupled to the pad 108, the large swing of the RF signal Srf may affect the state of the first switching circuit 1022. More specifically, the large swing of the RF signal Srf may turn on the drain-bulk PN junction of the N-type field-effected transistor MN1. Therefore, the first resistive circuit 1022a is arranged to couple between the bulk, i.e. the P-well, and the ground voltage AVSS to limit the current I1 flowing into the bulk from the ground voltage AVSS when the voltage level of the signal node N2 reaches the second predetermined voltage level Vp2.

Figure 2A:
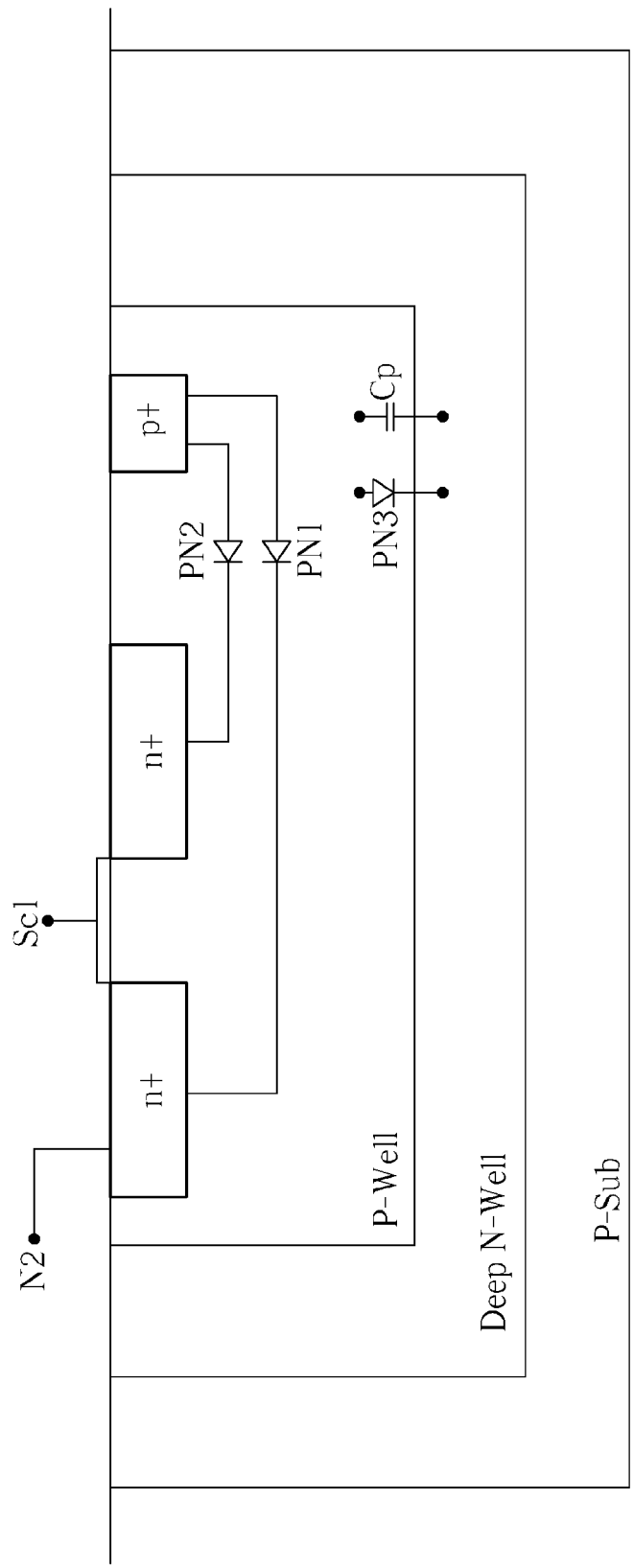
FIG. 2A is a diagram illustrating a simplified cross sectional of a first switching circuit without a first resistive circuit, a capacitive circuit, and a second resistive circuit.
Figure 2B:
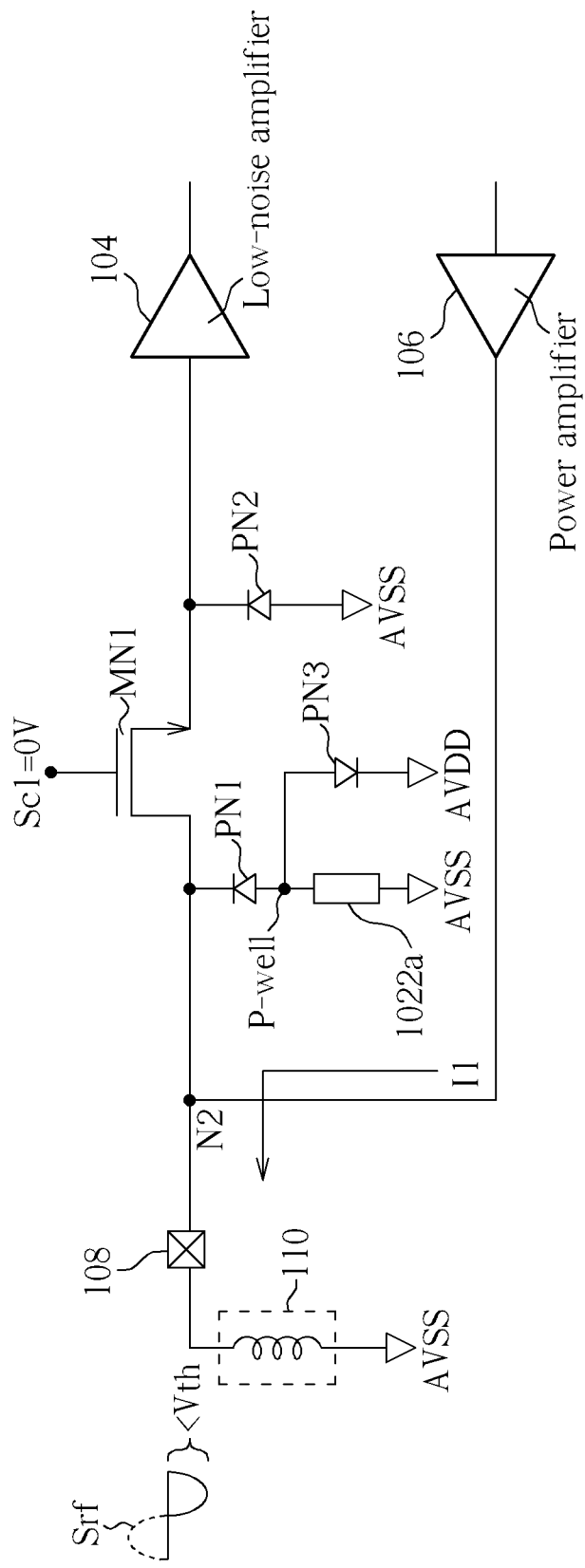
FIG. 2B is a simplified equivalent circuit diagram illustrating a front end circuit of a first switching circuit when a first resistive circuit is inserted between a P-well and a ground voltage.

Please refer to FIG. 2A in conjunction with FIG. 2B. FIG. 2A is a diagram illustrating the simplified cross sectional of the first switching circuit 1022 without the first resistive circuit 1022a, the capacitive circuit 1022b, and the second resistive circuit 1022c. FIG. 2B is a simplified equivalent circuit diagram illustrating the front end circuit 100 of the first switching circuit 1022 when the first resistive circuit 1022a is inserted between the P-well and the ground voltage AVSS. In FIG. 2A, the current I1 is induced to flow through the drain-bulk PN junction (i.e. PN junction PN1) of the N-type field-effected transistor MN1 when the voltage level of the signal node N2 reaches the second predetermined voltage level Vp2 and makes the voltage drop of the PN junction PN1 reaching the threshold voltage (i.e. Vth). For simplification, the second predetermined voltage level Vp2 is set as 0V. After the first resistive circuit 1022a is inserted between the P-well and the ground voltage AVSS as shown in FIG. 2B, the first resistive circuit 1022a will limit the current I1 induced by the swing of the RF signal Srf. It should be noted that the current I1 is an AC (Alternating Current) current in this exemplary embodiment. It should be noted that the PN junction PN2 is the source-bulk PN junction of the N-type field-effected transistor MN1.

Figure 2C:
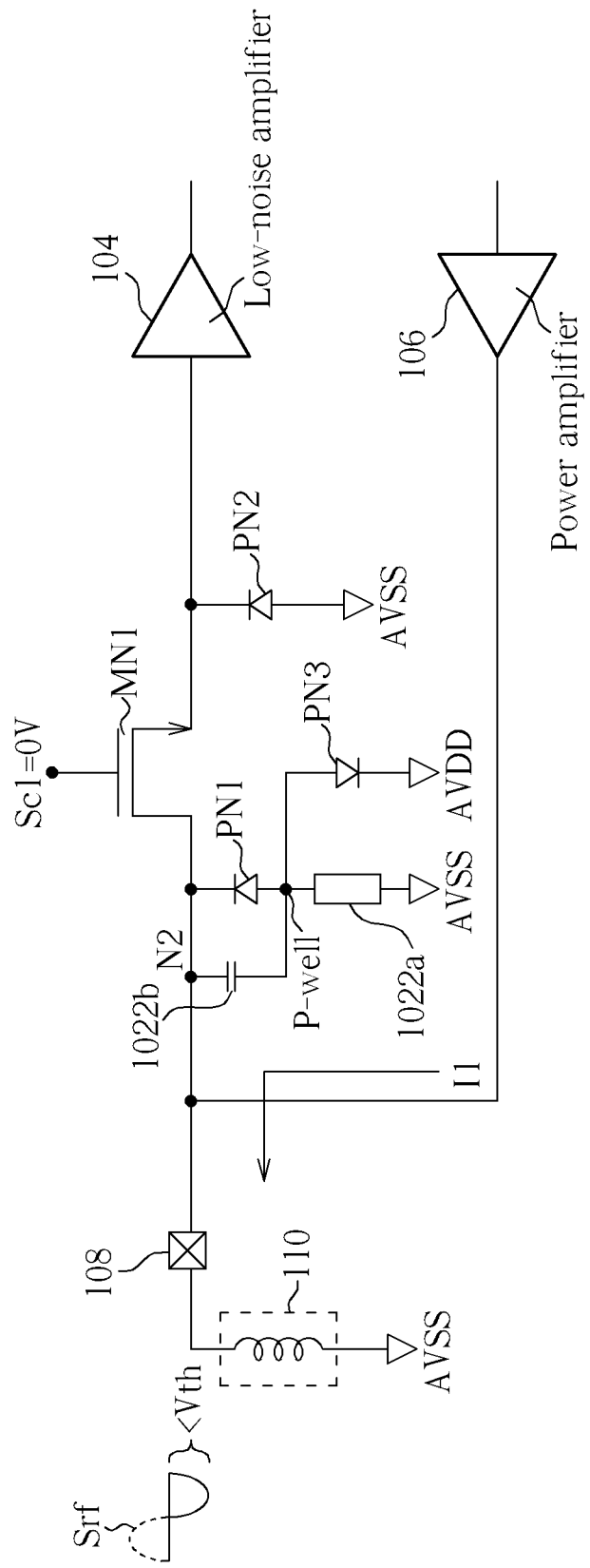
FIG. 2C is a simplified equivalent circuit diagram illustrating a front end circuit of a first switching circuit when a capacitive circuit is further inserted between a drain of an N-type field-effected transistor and a P-well.

Furthermore, in order to well control the first switching circuit 1022, the capacitive circuit 1022b is further added to couple between the drain (i.e. N2) of the N-type field-effected transistor MN1 and the P-well to make the AC voltage from the P-well to follow the voltage at the drain of the N-type field-effected transistor MN1 as shown in FIG. 2C. FIG. 2C is a simplified equivalent circuit diagram illustrating the front end circuit 100 of the first switching circuit 1022 when the capacitive circuit 1022b is further inserted between the drain of the N-type field-effected transistor MN1 and the P-well. Accordingly, under this arrangement, an AC (Alternating Current) voltage at the P-well may follow an AC voltage at the drain (i.e., the signal node N2) of the N-type field-effected transistor MN1, thus the PN junction PN1 is ensured to never turn on when the current I1 is induced by the swing of the RF signal Srf. More specifically, the first resistive circuit 1022a and the capacitive circuit 1022b are arranged to form a high-pass RC filter, and 3 dB corner frequency of this high-pass RC filter may be designed to be ten times lower than the FM band.

Figure 2D:
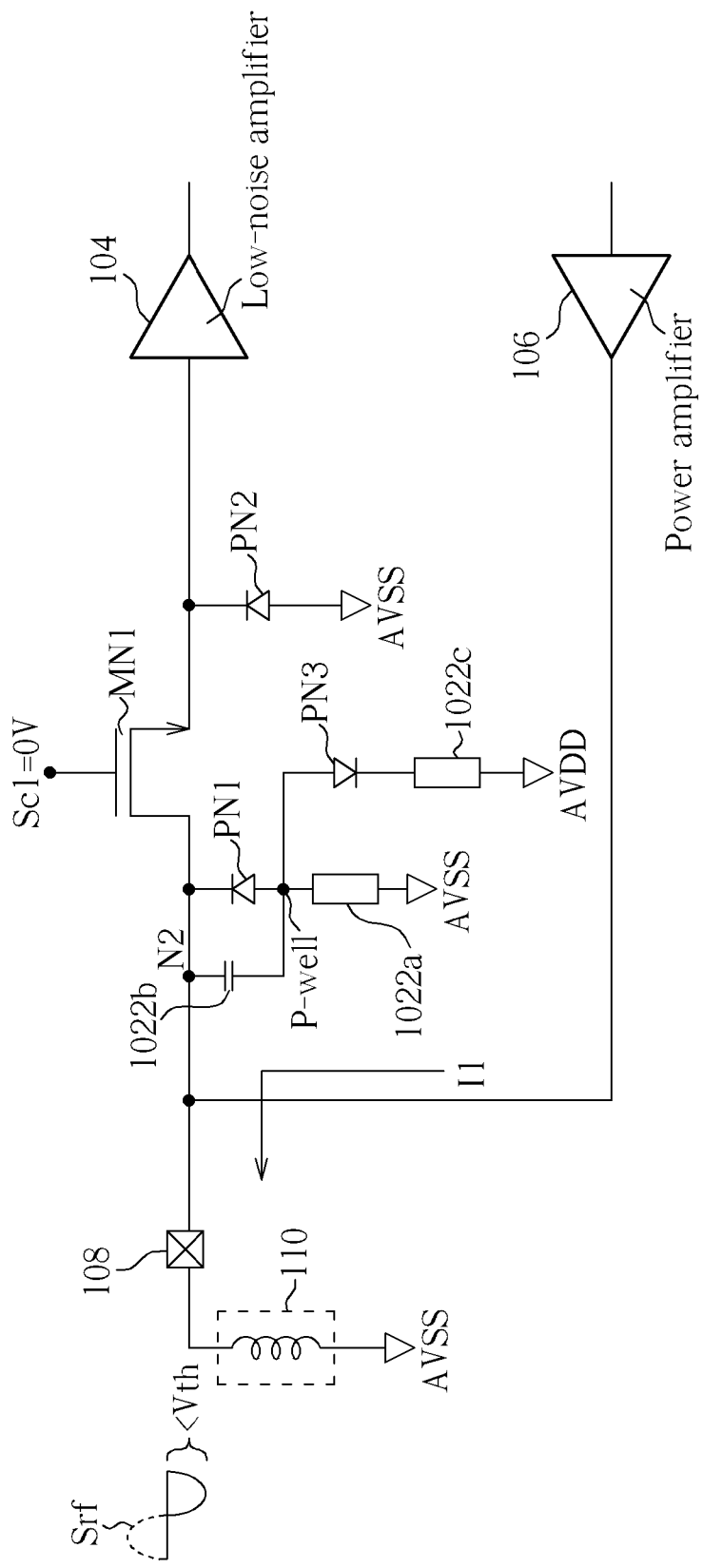
FIG. 2D is a simplified equivalent circuit diagram illustrating a front end circuit of a first switching circuit when a second resistive circuit is further inserted in series with a deep N-well of an N-type field-effected transistor.

In addition, the parasitic capacitor Cp between the P-well and the deep N-well causes a zero and deteriorates the function of the high-pass RC filter comprised of the first resistive circuit 1022a and the capacitive circuit 1022b. Therefore, the second resistive circuit 1022c having a large resistance is inserted in series with the deep N-well of the N-type field-effected transistor MN1 to adjust a frequency of the zero so as to minimize the impact of the parasitic capacitor Cp made upon the high-pass RC filter as shown in FIG. 2D. FIG. 2D is a simplified equivalent circuit diagram illustrating the front end circuit 100 of the first switching circuit 1022 when the second resistive circuit 1022c is further inserted in series with the deep N-well of the N-type field-effected transistor MN1. It should be noted that the PN junction PN3 is the P-well-deep N-well PN junction of the N-type field-effected transistor MN1.

Moreover, during the transmitting mode, the RF signal Srf may also be possible to turn on the N-type field-effected transistor MN1 if the swing of the RF signal Srf is large enough since the voltage level of the first control signal Sc1 is 0V and the DC voltage at the signal node N2 is also biased at 0V during the transmitting mode. Therefore, the first control circuit 1024 is further included to make the control node N1 of the first switching circuit 1022 electrically connected to the signal node N2 when the voltage level Vn2 of the signal node N2 reaches the first predetermined voltage level Vp1 during the transmitting mode. Please refer to FIG. 1 again. The gate terminal of the field-effected transistor 1024a (i.e. the N-type field-effected transistor) in the first control circuit 1024 is coupled to the ground voltage AVSS, and the source terminal of the field-effected transistor 1024a is coupled to the signal node N2, which is also biased at 0V during the transmitting mode, therefore the field-effected transistor 1024a is turned off during the transmitting mode. However, if the power of the RF signal Srf is large and the swing of the RF signal Srf goes at least one threshold voltage Vth below the ground voltage AVSS, the field-effected transistor 1024a will turn on and short the drain terminal (i.e. N2) of the N-type field-effected transistor MN1 to the gate terminal (i.e. N1) of the N-type field-effected transistor MN1. Accordingly, when the field-effected transistor 1024a is turned on, the gate terminal (i.e. N1) of the N-type field-effected transistor MN1 follows the AC swing of the drain terminal (i.e. N2) of the N-type field-effected transistor MN1. Therefore, the N-type field-effected transistor MN1 will never be turned on even when the swing of the RF signal Srf is large. It is noted that the first predetermined voltage level Vp1 can be set as the voltage level at least one threshold voltage Vth below the ground voltage AVSS in this exemplary embodiment.

In addition, the technique used in the first switching circuit 1022 may also be applied in the field-effected transistor 1024a for preventing the similar problem, i.e. for preventing the turn-on of the drain-bulk PN junction in the field-effected transistor 1024a, and the detailed description is omitted here for brevity.

On the other hand, when the front end circuit 100 is arranged to receive a RF (Radio Frequency) signal Srf via the embedded antenna, i.e. the receiving mode, the first switching circuit 1022 is controlled to turn on by the first control signal Sc1 to make the signal node N2 to connect the low-noise amplifier 104, i.e. the voltage level of the first control signal Sc1 is controlled to be the high voltage level, e.g. AVDD, to turn on the first switching circuit 1022. Then, the low-noise amplifier 104 is arranged to receive the RF signal Srf from the embedded antenna via the pad 108. According to the exemplary embodiment of the present invention, the P-type field-effected transistor of the second control circuit 1026 is controlled to turn on during the receiving mode to provide the supply voltage AVDD to the control node (i.e. N1) of the first switching circuit 1022. More specifically, when the front end circuit 100 operates in the receiving mode, the RF signal Srf may has a large swing to make the field-effected transistor 1024a to turn on accidentally if without the P-type field-effected transistor (i.e. 1026). As a result, the power of the RF signal Srf may be passed to the gate terminal (i.e. N1) of the N-type field-effected transistor MN1 that could deteriorate the quality, e.g. linearity, of the received RF signal Srf. Therefore, when the P-type field-effected transistor (i.e. 1026) is included, the second control signal Sc2, which is the inverse version of the first control signal Sc1, is arranged to turn on the P-type field-effected transistor (i.e. 1026) to provide the supply voltage AVDD to the gate terminal (i.e. N1) of the N-type field-effected transistor MN1. Accordingly, the gate terminal (i.e. N1) of the N-type field-effected transistor MN1 is always biased at the supply voltage AVDD regardless the swing of the received RF signal Srf.

Moreover, when the front end circuit 100 operates in the transmitting mode, the biasing circuit 112 is arranged to make the source terminal of the N-type field-effected transistor MN1 to be biased at the third predetermined voltage level Vp3 (e.g. any voltage level between AVDD and AVSS) to make the input terminal of the low-noise amplifier 104 to be biased at the third predetermined voltage level Vp3. However, when the front end circuit 100 operates in the receiving mode, the first resistive circuit RS1 and the second resistive circuit RS2 in the biasing circuit 112 are both controlled to electrically disconnect from the source terminal of the N-type field-effected transistor MN1 to make sure that the source to bulk diode of the N-type field-effected transistor MN1 never turns on under the large signal swing.

According to the exemplary embodiment of the present invention, the resistive circuit 1024b is included for the purpose of ESD (Electrostatic Discharge) protection. More specifically, the resistive circuit 1024b is for ESD protection of the relatively small device 1024a as well as inducing a voltage drop to ensure that the N-type field-effected transistor MN1 can be turned on during the large signal swing.

In addition, the resistive circuit 1024c and the resistive circuit 1024d are included for the purpose of reducing the loading of the nonlinear capacitors (i.e. the gate-drain capacitor Cgd and the gate-source capacitor Cgs) of the field-effected transistor 1024a and the N-type field-effected transistor MN1 respectively. In other words, the resistive circuit 1024c and the resistive circuit 1024d are capable of reducing the impact on signal distortion. It should be noted that because the field-effected transistor 1024a is a much smaller device than the N-type field-effected transistor MN1, the resistive circuit 1024c is set to have a relatively small resistance and serves mainly to improve the ESD performance of the field-effected transistor 1024a.

Briefly, the embodiments of the present invention arrange the first resistive circuit 1022a to limit the current flowing into the P-well from the ground voltage AVSS when T/R switch operates in the transmitting mode, arranges the field-effected transistor 1024a to make the N-type field-effected transistor MN1 always turned off when the T/R switch operates in the transmitting mode, and arranges the first switching circuit 1022 to make the N-type field-effected transistor MN1 always turned on when the T/R switch operates in the receiving mode. Accordingly, the T/R switch has the characteristic of high linearity, low distortion, low insertion loss, and large signal swing is provided.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A switching device, comprising:
a first switching circuit, having a control node coupled to a first control signal, the first switching circuit arranged to selectively couple a signal node to a first amplifying circuit according to the first control signal; and
a first control circuit, having a first control node and a second control node coupled to the control node of the first switching circuit and the signal node, respectively, wherein when the first switching circuit is controlled to electrically disconnect the signal node from the first amplifying circuit, the first control circuit is turned off to disconnect the control node of the first switching circuit from the signal node until a voltage level of the signal node reaches a first predetermined voltage level, and wherein when the voltage level of the signal node reaches the first predetermined voltage level, the first control circuit is arranged to make the control node of the first switching circuit electrically connected to the signal node.

2. The switching device of claim 1, wherein the first control circuit comprises:
a field-effected transistor, having a gate node coupled to a reference voltage, a first connecting node coupled to the first control node, and a second connecting node coupled to the second control node.

3. The switching device of claim 2, wherein the field-effected transistor is an N-type field-effected transistor, and the reference voltage is a ground voltage.

4. The switching device of claim 2, wherein the first control circuit further comprises:
a resistive circuit, coupled between the second connecting node of the field-effected transistor and the second control node.

5. The switching device of claim 2, wherein the first control circuit further comprises:
a resistive circuit, coupled between the gate node of the field-effected transistor and the reference voltage.

6. The switching device of claim 1, further comprising:
a second control circuit, having a first control node and a second control node coupled to the control node of the first switching circuit and a reference voltage, respectively, the second control circuit arranged to keep a voltage level of the control node of the first switching circuit substantially intact when the first switching circuit is controlled to connect the signal node from the first amplifying circuit.

7. The switching device of claim 6, wherein the second control circuit comprises:
a field-effected transistor, having a gate node coupled to a second control signal, a first connecting node coupled to the control node of the first switching circuit, and a second connecting node coupled to the reference voltage.

8. The switching device of claim 7, wherein the field-effected transistor is a P-type field-effected transistor, and the reference voltage is a supply voltage.

9. The switching device of claim 7, wherein the second control signal is an inverse version of the first control signal.

10. The switching device of claim 1, wherein the first switching circuit comprises:
a field-effected transistor, having a gate node coupled to the first control signal, a first connecting node coupled to the signal node, and a second connecting node coupled to the first amplifying circuit, the field-effected transistor formed in a first doped well; and
a first resistive circuit, coupled to the first doped well in series and arranged to limit a current flowing into the first doped well when the first switching circuit is controlled to electrically disconnect the signal node from the first amplifying circuit and the voltage level of the signal node reaches a second predetermined voltage level.

11. The switching device of claim 10, wherein the first switching circuit further comprises:
a capacitive circuit, coupled between the first connecting node of the field-effected transistor and the first doped well.

12. The switching device of claim 10, wherein the field-effected transistor is further formed in a second doped well, and the first switching circuit further comprises:
a second resistive circuit, coupled to the second doped well in series.

13. The switching device of claim 10, wherein the first switching circuit further comprises:
a resistive circuit, coupled between the gate node of the field-effected transistor and the first control signal.

14. The switching device of claim 10, further comprising:
a biasing circuit, arranged to make the second connecting node of the field-effected transistor to be biased at a third predetermined voltage level when the first switching circuit is controlled to electrically disconnect the signal node from the first amplifying circuit.

15. The switching device of claim 10, wherein the field-effected transistor is an N-type field-effected transistor.

16. A switching device, comprising:
a switching circuit, having a control node coupled to a first control signal, the switching circuit arranged to selectively couple a signal node to a first amplifying circuit according to the first control signal, the switching circuit comprising:
a field-effected transistor, having a gate node coupled to the first control signal, a first connecting node coupled to the signal node, and a second connecting node coupled to the first amplifying circuit, the field-effected transistor formed in a first doped well;

a first resistive circuit, coupled to the first doped well in series, wherein when the switching circuit is controlled to electrically disconnect the signal node from the first amplifying circuit and the voltage level of the signal node reaches a second predetermined voltage level, the first resistive circuit is arranged to limit a current flowing into the first doped well; and a capacitive circuit, coupled between the first connecting node of the field-effected transistor and the first doped well;

wherein the capacitive circuit is arranged to make an AC (Alternating Current) voltage at the first doped well to follow an AC voltage at the first connecting node of the field-effected transistor.

17. The switching device of claim 16, wherein the field-effected transistor is further formed in a second doped well, and a zero is generated due to a parasitic capacitor between the first doped well and the second doped well, and the switching circuit further comprises:

a second resistive circuit, coupled to the second doped well in series so as to adjust a frequency of the zero.

18. The switching device of claim 16, wherein the switching circuit further comprises:

a resistive circuit, coupled between the gate node of the field-effected transistor and the first control signal so as to reduce signal distortion caused by the field-effected transistor.

19. The switching device of claim 16, further comprising:

a biasing circuit, arranged to make the second connecting node of the field-effected transistor to be biased at a third predetermined voltage level when the switching circuit is controlled to electrically disconnect the signal node from the first amplifying circuit.

20. The switching device of claim 16, wherein the field-effected transistor is an N-type field-effected transistor.

21. A switching device, comprising:

a first switching circuit, having a control node coupled to a first control signal, the first switching circuit arranged to selectively couple a signal node to a first amplifying circuit according to the first control signal; and a first control circuit, having a first control node and a second control node coupled to the control node of the first switching circuit and the signal node, respectively, wherein when the first switching circuit is controlled to electrically disconnect the signal node from the first amplifying circuit and a voltage level of the signal node reaches a first predetermined voltage level, the first control circuit is arranged to make the control node of the first switching circuit electrically connected to the signal node;

wherein the first control circuit comprises:

a field-effected transistor, having a gate node coupled to a reference voltage, a first connecting node coupled to the first control node, and a second connecting node coupled to the second control node; and a resistive circuit, coupled between the gate node of the field-effected transistor and the reference voltage.

22. A switching device, comprising:

a first switching circuit, having a control node coupled to a first control signal, the first switching circuit arranged to selectively couple a signal node to a first amplifying circuit according to the first control signal;

a first control circuit, having a first control node and a second control node coupled to the control node of the first switching circuit and the signal node, respectively, wherein when the first switching circuit is controlled to electrically disconnect the signal node from the first amplifying circuit and a voltage level of the signal node reaches a first predetermined voltage level, the first control circuit is arranged to make the control node of the first switching circuit electrically connected to the signal node; and a second control circuit, having a first control node and a second control node coupled to the control node of the first switching circuit and a reference voltage, respectively, the second control circuit arranged to keep a voltage level of the control node of the first switching circuit substantially intact when the first switching circuit is controlled to connect the signal node from the first amplifying circuit.

* * * * *